United States Patent [19]
Prakash et al.

[11] Patent Number: 5,748,127
[45] Date of Patent: May 5, 1998

[54] TWO CASCODED TRANSISTOR CHAINS BIASING DAC CURRENT CELLS

[75] Inventors: Jaideep Prakash, Dallas; John Paul Norsworthy, Lucas; Bruce Andrew Doyle, Richardson, all of Tex.

[73] Assignee: Cirrus Logic, Inc., Fremont, Calif.

[21] Appl. No.: 579,073

[22] Filed: Dec. 22, 1995

[51] Int. Cl.$^6$ .................................................. H03M 1/66
[52] U.S. Cl. .......................... 341/144; 341/136; 341/133; 327/541
[58] Field of Search ................................. 327/541, 543, 327/545, 546, 263, 264, 276, 277, 278, 376, 377, 393, 394, 395, 398, 399, 400; 341/133, 134, 135, 136, 144, 153, 154

[56] References Cited

U.S. PATENT DOCUMENTS

| | | | |
|---|---|---|---|
| 4,408,190 | 10/1983 | Nagano | 340/347 |
| 4,431,986 | 2/1984 | Haque et al. | 340/347 |
| 4,689,607 | 8/1987 | Robinson | 340/347 |
| 5,105,193 | 4/1992 | Vogt et al. | 341/154 |
| 5,148,065 | 9/1992 | Krenik et al. | 307/572 |
| 5,293,166 | 3/1994 | Ta | 341/118 |
| 5,369,406 | 11/1994 | Hughes | 341/135 |
| 5,399,960 | 3/1995 | Gross | 327/541 |
| 5,410,311 | 4/1995 | Doyle | 341/144 |
| 5,463,394 | 10/1995 | Sun | 341/136 |
| 5,594,382 | 1/1997 | Kato et al. | 327/541 |

*Primary Examiner*—Howard L. Williams
*Attorney, Agent, or Firm*—David H. Tannenbaum; Steven A. Shaw

[57] ABSTRACT

A precise current cell for a digital-to-analog (D/A) convertor circuit is designed to compensate for manufacturing process variations. The cell uses a cascoded transistor chain to control the output voltage and isolate voltage supply noise. An external (off-chip) bias current is fed into a cascoded biasing string of eight transistors, which are further mirrored to the current cell itself. The biasing scheme accounts for manufacturing process variations in the chip, which leads to very precise current being replicated at the output of the D/A circuit. Current steering and an improved shunt path within the current cell minimizes voltage swings during switching of the current cell. This allows for faster switching of the cell while minimizing noise coupling due to the voltage swings. The current cell also has an associated biasing stage. This biasing stage allows for improved matching within the current cell, resulting in improved accuracy of conversion. Additionally, the biasing circuit minimizes noise coupling from ground potential to the D/A convertor output. A reset circuit is also included. This current cell, associated biasing stage, and reset circuit is suitable for applications requirement precise D/A conversions at high speeds.

10 Claims, 2 Drawing Sheets

TWO CASCODED TRANSISTOR CHAINS BIASING DAC CURRENT CELLS

CROSS REFERENCE TO RELATED APPLICATIONS

The subject matter of this patent application is related to the subject matter of U.S. patent application Ser. No. 08/579,071, entitled SYSTEM AND METHOD FOR PROVIDING A SMOOTH OUTPUT FOR A D/A CONVERTOR USING CURRENT SOURCES, filed concurrently herewith, by inventors Jaideep Prakash and John Paul Norsworthy. The disclosure of the above-mentioned U.S. Patent Application is herein incorporated by reference. These applications are commonly assigned.

1. Technical Field of the Invention

This invention relates to a current cell structure and biasing stage for use in monolithic implementations of digital-to-analog (D/A) converter circuits and more particularly to a current cell for use in situations where precise current accuracy and fast switching are required.

2. Discussion of the Related Technology

D/A convertors are used in a variety of applications requiring the conversion of binary digital signals to analog signals. One particular application of D/A convertors is to generate color images on monitor displays whereby digital signals representing the colors red, green, and blue are converted to analog signals for display on a monitor. For the display of fine resolution images, the digital signals must be precisely converted to the analog signals used to generate images.

The concept of the D/A circuit is that, using a current from a current cell, an analog voltage is generated based on a digital signal input to the current cell. Thus, the accuracy of the current in the current cell defines the accuracy of the D/A conversion. The main problem with the prior art is that the prior art structure creates a limitation on the fineness of the generated output current.

Accordingly, a current cell is needed that produces a very precise current based on a given bias current provided by an external source.

Additionally, it is preferable that a D/A convertor have low noise coupling to the output node of the circuit, because also noise sets a limit on the preciseness of a D/A conversion.

SUMMARY OF THE INVENTION

This and other objects, features and advantages have been achieved by a system and method for providing a precise current using a cascoded transistor configuration in a current cell, which then provides for a more precise current at the output of the current cell. A biasing stage was designed that allows for compensation of process variations in the manufacture of the current cell and was cascoded to allow better rejection of power supply noise, which leads to lower noise coupling at the output node. An improved reset circuit is also included. This current cell, associated bias stage, and reset circuit is suitable for applications requirement precise D/A conversions at high speeds.

An external (off-chip) bias current is fed into a cascoded biasing string of eight transistors, which are further mirrored to the current cell itself. The biasing scheme compensates for manufacturing process variations in the chip, which leads to very precise current being replicated at the output of the D/A circuit.

Current steering within the current cell in conjunction with a diode-connected transistor device in a shunt to ground potential minimizes voltage swings during switching of the current cell. This allows for faster switching of the cell while minimizing noise coupling due to the voltage swings. Also, a modified biasing current for the current cell was included. The biasing stage allows for improved matching within the current cell, resulting in improved accuracy of conversion. Additionally, the biasing stage minimizes noise coupling from ground potential to the D/A convertor output.

One major technical advantage of our invention is that a more precise current is produced at the output. A second technical advantage is that a more precise analog conversion from a digital input is accomplished. A still further technical advantage of this invention is that there is greater D/A circuit power supply noise rejection at the output node, which improves the performance of the D/A converter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 2:
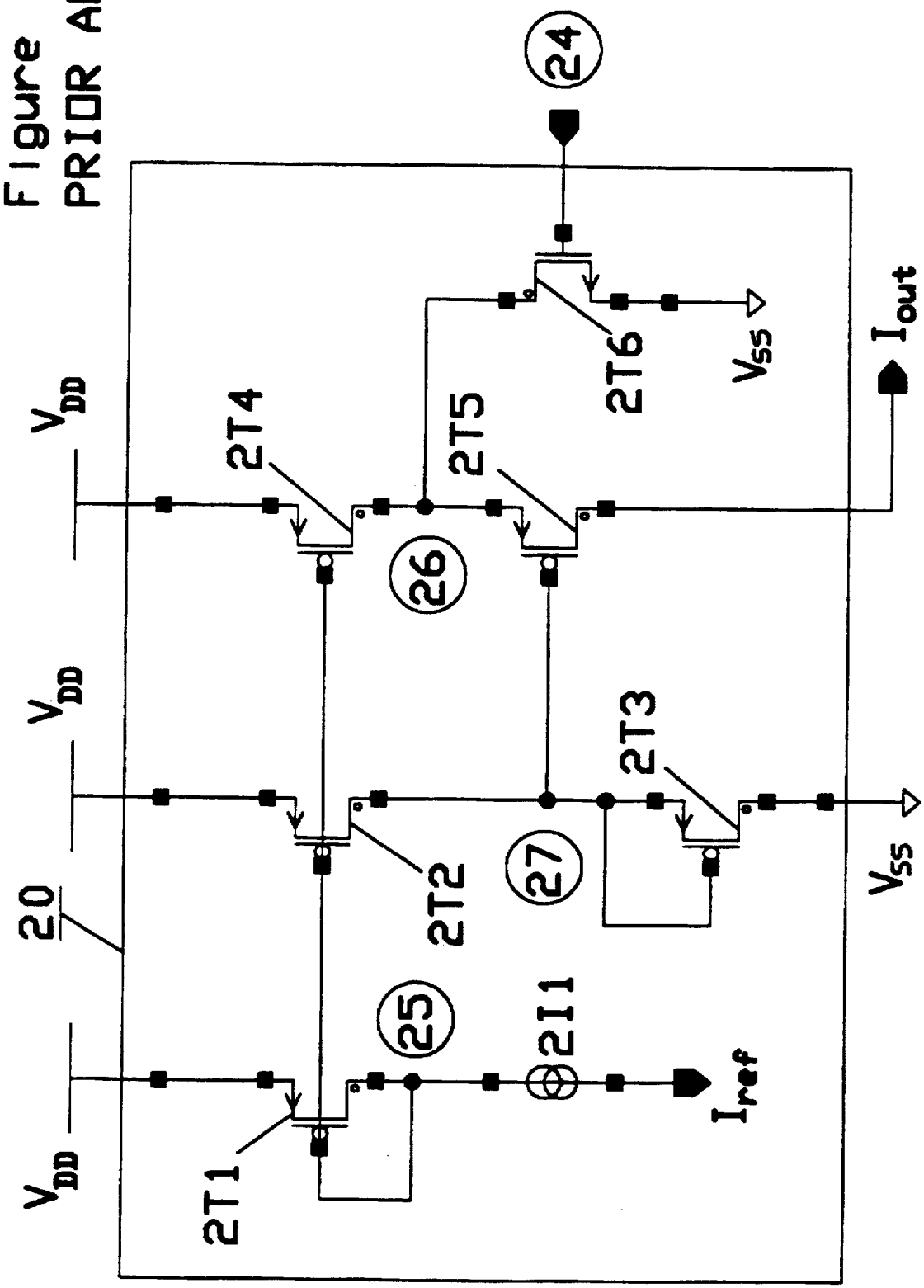
FIG. 2 shows a typical prior art current cell with a biasing stage.

Before discussing the implementation of the preferred embodiment, it might be helpful to review the prior art with respect to FIG. 2. FIG. 2 shows typical prior art current cell with a biasing stage as circuit 20. In the prior art, based on the state of the binary input at node 24, current is either switched to output $I_{out}$ or shunted through transistor device 2T6. During the period when output $I_{out}$ is active, node 26 is forced to be at a voltage necessary for device 2T5 to support current cell bias current reference 2I1. For the period when current is shunted through device 2T6, node 26 is discharged to ground potential $V_{SS}$.

It is desirable to limit this voltage swing at node 26, because the charging and discharging time at this node limits the speed at which switching can occur. Also, this charging and discharging during switching has the undesirable effect of coupling noise to nodes 25 and 27, causing modulation of the current at output $I_{out}$.

An additional problem exists in the prior art when generating a bias voltage at node 27. This bias voltage represents the turn-on voltage of device 2T3. The turn-on voltage of device 2T3, however, is not fixed during the manufacturing process and can lead to variations in the bias voltage at node 26 during the active period of the current cell.

Modulation of the voltage at node 26 in turn modulates the drain-to-source voltage of device 2T4, which in turn modulates the generated current at output $I_{out}$. Depending on manufacturing process tolerances, this variation can be large, which greatly limits the accuracy of the D/A conversion. Also, because device 2T3 is connected as a diode-connected device to ground potential $V_{SS}$, any noise at the ground potential is coupled to the gate of device 2T5, which in turn also modulates the output current at output $I_{out}$.

During operation of the prior art current cell shown in FIG. 2, an external (off chip) current $I_{ref}$, represented by current cell bias current reference 2I1, is sourced to transistor 2T1, which in turn is connected to power supply $V_{DD}$. Power supply $V_{DD}$ is normally connected to either five volts or three volts, however, any voltage can be used. The current $I_{ref}$ is further mirrored to transistor 2T2, which forces the same current to flow in transistor 2T3, connected as a diode. Transistor 2T3 is connected to ground potential $V_{SS}$, typically zero volts, however, any appropriate voltage may be used. The current produced in transistor 2T3 generates a voltage at node 27, which is applied to the gate of transistor 2T5. Transistor 2T4, by way of having a common voltage at node 25, also has reference current $I_{ref}$ flowing through it. Transistor 2T5 supports this same current under the condition that transistor 2T6 is "off." If transistor 2T6 is "on," current flow goes from transistor 2T4 to transistor 2T6, and the current at output $I_{out}$ is zero.

The on/off action of the current cell is forced by the switching of node 24 from a high voltage to a low voltage. Input node 24 represents a binary input to the current cell indicating whether an "on" or "off" condition is desired at output $I_{out}$. Voltage at input node 24 overdrives the current to where transistor 2T6 supports all of the current flow of transistor 2T4.

The problem with the prior art circuit shown in FIG. 2 is that the voltage generated at node 27 forces a gate-to-source voltage at transistor 2T5 that supports the current flow of current reference 2I1 through the current cell. This voltage at node 27, however, is variable because the gate-to-source voltage of transistor 2T3 depends on the process parameters under which the integrated circuit is being manufactured. This variation leads to the node voltage at node 26 also varying with the process parameters. This variation sets a channel length modulation of device transistor 2T4, which in turn modulates the current at output $I_{out}$ of the current cell. This modulation is undesirable because it limits the accuracy of the D/A conversion. An additional side effect is that the diode-connected device 2T3 to node 27 modulates the gate-to-source voltage of transistor 2T5, which leads to noise coupling at the output $I_{out}$.

Figure 1:
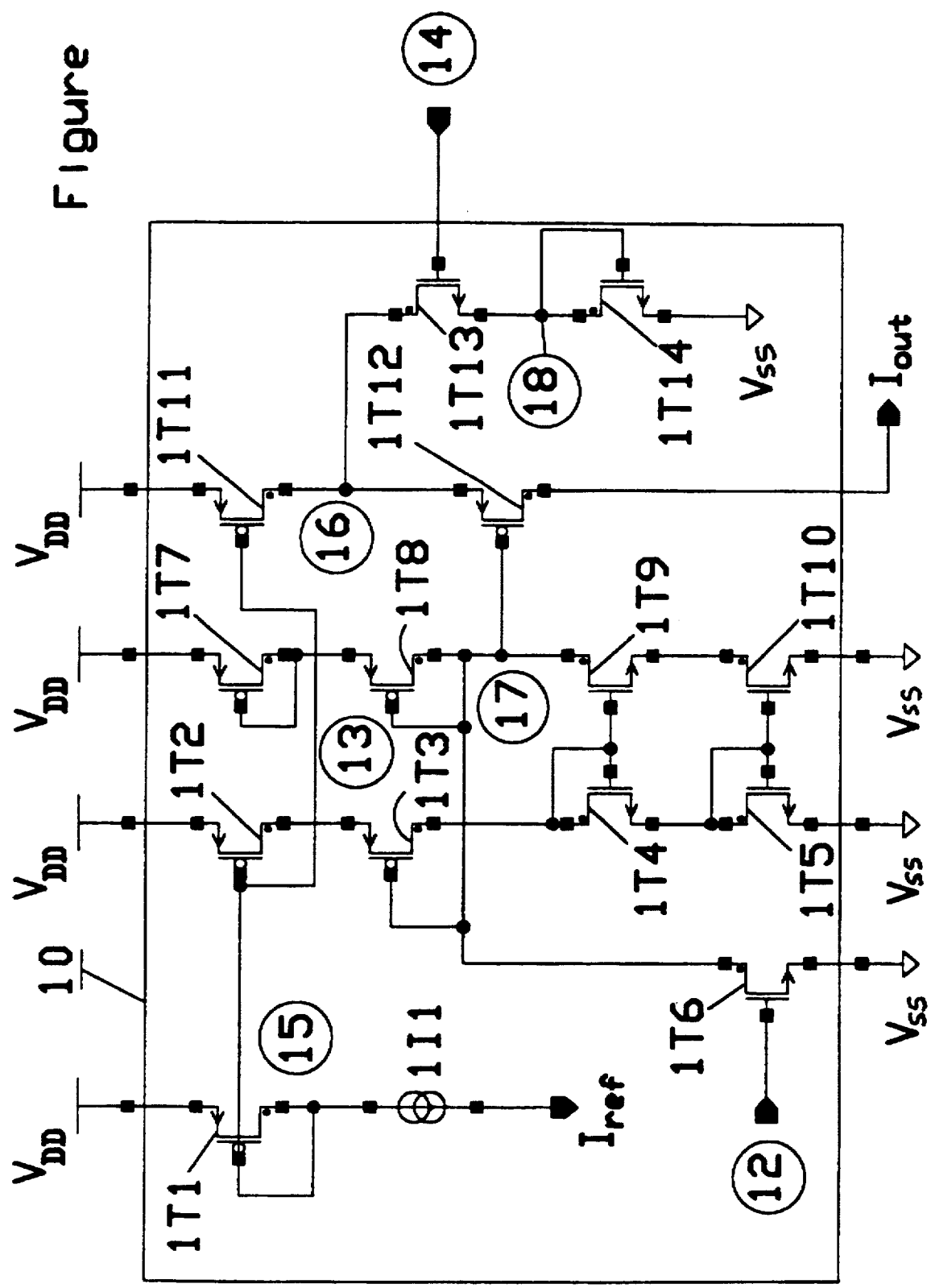
FIG. 1 shows the details of the preferred embodiment of the current cell, associated biasing stage, and reset circuit.

Going now to FIG. 1, FIG. 1 shows the details of the preferred embodiment of the current cell, associated biasing stage, and reset circuit. Circuit 10 includes a current cell, a biasing stage, and a reset circuit. The current cell includes devices 1T11, 1T12, 1T13, and 1T14. In response to a binary signal of either logic level "1" or "0" at input node 14, the current cell switches current to output $I_{out}$ or shunts the current through devices 1T13 and 1T14. The current through device 1T11 is maintained at a constant level, and a steering approach is used to minimize the glitch energy.

In this implementation, bias current $I_{ref}$ is mirrored in the biasing stage using transistors 1T2, 1T3, 1T4, and 1T5, which in turn mirror the same current $I_{ref}$ into the biasing stage having transistors 1T7, 1T8, 1T9, and 1T10. The biasing stage is cascoded to provide precise mirroring of the bias current $I_{ref}$. Additionally, the cascoded devices 1T9 and 1T10 provide a high-impedance path from the bias voltage at node 17 to ground potential $V_{SS}$. The bias voltage at node 17 is set by the turn-on voltage of device 1T8, which is proportional to the current through device 1T8. The bias voltage at node 17 is also applied to the gate of current cell device 1T12, which forces the voltage at node 16 to follow the voltage at node 13, because 1T11 is also sourcing current $I_{ref}$. This is a preferred implementation across manufacturing process variations because the voltage at node 16 is adjusted so that device 1T11 has the required drain-to-source voltage to provide the correct current to the current cell output $I_{out}$.

Additionally, device 1T14 is added in series with device 1T13 to ground potential $V_{SS}$. This forces node 16 to operate at a potential equal to the turn-on voltage of device 1T14 and the drain-to-source voltage of device 1T13. Device 1T14 can be sized appropriately to minimize the voltage swing at node 16 during the period when the current cell is switching states. An additional diode-connected device can be added in series with device 1T14 if a greater voltage potential is required at node 16 during the period the binary input 14 is at a logic level "1." Controlling the voltage swing at node 16 is desirable because this allows faster switching of the current cell while minimizing noise coupling.

Circuit 10 also includes a reset circuit. Device 1T6 is added to insure that the bias circuit is in the proper state during start-up. Input node 12 is connected to a master reset signal that is turned on at power up, which forces current flow through the cascoded string of transistor devices 1T2, 1T3, 1T4, 1T5, and 1T7, 1T8, 1T9, 1T10. During the period when the reset signal is active (e.g., at a logic level "1") device 1T6 starts conducting current, pulling down the voltage at node 17. This insures that when the reset signal is disabled, at a logic level "0," there is current flow in the bias circuit because a sufficient gate-to-source voltage exists for devices 1T3 and 1T8 to start conducting current.

During operation of the preferred embodiment, current reference 1I1 provides current $I_{ref}$ from off-chip to transistor 1T1, which is connected to a power supply $V_{DD}$ that is usually either five volts or three volts but can be any desired voltage. This current $I_{ref}$ is additionally mirrored to device transistors 1T2, 1T3, 1T4, and 1T5, forming a cascoded bias string. The current is further mirrored to device transistors 1T7, 1T8, 1T9, and 1T10. The voltage at node 17 represents the turn-on voltage of transistor 1T8. This voltage is further mirrored to node 16, which sets the gate-to-source bias of device transistor 1T12 and also sets the channel length modulation of transistor 1T11, which is ultimately the control current for the current cell.

Note significantly that the gate-to-source bias of transistor 1T2 is set by the off-chip reference current, which is independent of the manufacturing process and does not change. Thus, $I_{out}$ is constant over the nominal process variations of the integrated circuit. An additional byproduct is that there is a cascoded connection of transistor 1T10 and transistor 1T9 from ground potential $V_{SS}$ to node 17, which improves power supply noise rejection. An additional improvement of this circuit is that the voltage at node 16 is controlled by an additional device, which is transistor 1T14 connected as a diode connection. Transistors 1T13 and 1T14 form a shunt connection that was previously implemented as a single device. Appropriately sizing of transistor 1T14 advantageously limits the voltage swing at node 16.

Although the present invention and its advantages have been described in detail, it should be understood that various changes, substitutions and alterations can be made herein without departing from the spirit and scope of the invention as defined by the appended claims.

We claim:

1. A digital-to-analog converter circuit comprising:
   (A) a biasing stage for mirroring a reference current to bias a switching transistor independent of manufacturing process variations, wherein said biasing stage comprises a first cascoded transistor chain and a second cascoded transistor chain; and
   (B) a current cell for receiving the mirrored reference current comprising:
      (1) the switching transistor;
      (2) a digital input node; and
      (3) an analog current output node,
   wherein the switching transistor switches a current either to a shunt path to ground potential or the output node depending on the input at the input node.

2. A convertor circuit according to claim 1, wherein the shunt path comprises a first transistor connected to the input node and a second transistor connected to ground potential.

3. A convertor circuit according to claim 2, wherein the second transistor is a diode-connected transistor.

4. A convertor circuit according to claim 1, further comprising:
   a reset circuit having a reset input node for providing a biasing current to the biasing stage when the reset input node is active.

5. A method for providing a precise current cell comprising the steps of:
   providing a biasing current that is independent of manufacturing process variations to bias a switching transistor by mirroring a reference current in a biasing stage,
   wherein said biasing stage comprises a first cascoded transistor chain and a second cascoded transistor chain, and
   wherein said mirroring step comprises:
      first-mirroring the reference current in said first cascoded transistor chain and
      second-mirroring the first-mirrored reference current in a second cascoded transistor chain; and
   controlling the switching transistor to switch a current to either an analog current output node or a shunt path to ground potential depending on an input at a digital input node.

6. A method for providing a precise current cell according to claim 5, wherein the shunt path comprises a first transistor connected to the input node and a second transistor connected to ground potential.

7. A method for providing a precise current cell according to claim 6, wherein the second transistor is a diode-connected transistor.

8. A method for providing a precise current cell according to claim 5, further comprising the step of:
   applying a reset signal to a reset input to provide current to the biasing stage before the step of providing.

9. A digital-to-analog converter circuit comprising:
   means for biasing a switching means independent of manufacturing process variations, said biasing means comprising means for mirroring a reference current, wherein said mirroring means comprises:
      means for first-mirroring a reference current in a first cascoded transistor chain, and
      means for second-mirroring the first-mirrored reference current in a second cascoded transistor chain; and
   means for controlling the switching means to switch a current to either an analog current output node or a shunt path to ground potential depending on the input at a digital input node.

10. A convertor circuit according to claim 9, further comprising:
    means for applying a reset signal to a reset input to provide current to the biasing stage means.

* * * * *